(12) United States Patent
Marbella et al.

(10) Patent No.: US 10,181,439 B2
(45) Date of Patent: Jan. 15, 2019

(54) SUBSTRATE AND METHOD FOR FABRICATION THEREOF (71) Applicant: Infineon Technologies AG, Neubiberg (DE)

(72) Inventors: Carlo Marbella, Singapore (SG); Marc Dittes, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/962,404

(22) Filed: Apr. 25, 2018

(65) Prior Publication Data

US 2018/0315692 A1    Nov. 1, 2018

(30) Foreign Application Priority Data

Apr. 26, 2017    (DE) .................. 10 2017 206 992

(51) Int. Cl.
| | | |
|---|---|---|
| H05K 1/02 | (2006.01) | |
| H05K 3/02 | (2006.01) | |
| H01L 23/498 | (2006.01) | |
| H01L 21/48 | (2006.01) | |

(52) U.S. Cl.
CPC .... *H01L 23/49838* (2013.01); *H01L 21/4857* (2013.01); *H01L 23/49811* (2013.01); *H01L 23/49822* (2013.01)

(58) Field of Classification Search
CPC ........ H05K 1/0296; H05K 1/11; H05K 1/111; H05K 3/02; H05K 3/22
See application file for complete search history.

(56) References Cited

U.S. PATENT DOCUMENTS

2008/0111571 A1    5/2008  Smith et al.

*Primary Examiner* — Jeremy C Norris
(74) *Attorney, Agent, or Firm* — Dicke, Billig & Czaja, PLLC (57) ABSTRACT

A substrate and method of fabrication is disclosed. In one example, the substrate includes a first dielectric layer, a first and a second conductive trace arranged over the first dielectric layer and a second dielectric layer arranged between the first and second conductive traces and partially covering the first and second conductive traces, wherein an exposed part of the first and second conductive traces is exposed from the second dielectric layer at an interface and wherein a shape of the interface between the first and second conductive traces includes one or more of an angle, an edge, a curvature, a bulge, a step and an indentation.

18 Claims, 5 Drawing Sheets

SUBSTRATE AND METHOD FOR FABRICATION THEREOF

CROSS-REFERENCE TO RELATED APPLICATION

This Utility Patent Application claims priority to German Patent Application No. 10 2017 206 992.9, filed Apr. 26, 2017, which is incorporated herein by reference.

TECHNICAL FIELD

The present disclosure relates to substrates and methods for fabrication thereof. In particular, the disclosure relates to substrates for electronic devices.

BACKGROUND

Electronic devices or substrates for electronic devices may include multiple conductive traces that are configured to connect electronic components with one another. Such conductive traces may be at least partially surrounded by dielectric material. At an interface the conductive traces may be exposed from the dielectric material or two dielectric materials may be in contact at an interface. Such an interface may represent a potential leakage path. For example, due to electrochemical migration an unwanted short circuit between two adjacent conductive traces may form along the interface. The trend of miniaturization of electronic devices may aggravate this problem. Therefore, new ways to alleviate or prevent the formation of a leakage path along an interface are necessary.

SUMMARY

Various aspects pertain to a substrate comprising a first dielectric layer, a first and a second conductive trace arranged over the first dielectric layer and a second dielectric layer arranged between the first and second conductive traces and partially covering the first and second conductive traces, wherein an exposed part of the first and second conductive traces is exposed from the second dielectric layer at an interface and wherein a shape of the interface between the first and second conductive traces comprises one or more of an angle, an edge, a curvature, a bulge, a step and an indentation.

Various aspects pertain to a method for fabricating a substrate, wherein the method comprises providing a first dielectric layer, providing a first and a second conductive trace arranged over the first dielectric layer, providing a second dielectric layer arranged between the first and second conductive traces and partially covering the first and second conductive traces such that an exposed part of the first and second conductive traces is exposed from the second dielectric layer at an interface, wherein a shape of the interface between the first and second conductive traces comprises one or more of an angle, an edge, a curvature, a bulge, a step and an indentation.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

FIGS. 1A to 1C show an example of a substrate for an electronic device according to the disclosure, wherein

DETAILED DESCRIPTION

In the following detailed description, reference is made to the accompanying drawings. It may be evident, however, to one skilled in the art that one or more aspects of the disclosure may be practiced with a lesser degree of the specific details. In other instances, known structures and elements are shown in schematic form in order to facilitate describing one or more aspects of the disclosure. In this regard, directional terminology, such as "top", "bottom", "left", "right", "upper", "lower" etc., is used with reference to the orientation of the Figures being described. Because components of the disclosure can be positioned in a number of different orientations, the directional terminology is used for purposes of illustration and is in no way limiting. It is to be understood that other examples may be utilized and structural or logical changes may be made without departing from the concept of the present disclosure. The following detailed description, therefore, is not to be taken in a limiting sense.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted.

Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements. Also, the term "exemplary" is merely meant as an example, rather than the best or optimal.

One or more semiconductor chip(s) may be bonded to a substrate for an electronic device according to the disclosure. The substrate may be a (permanent) device carrier used for packaging. The carrier may include or consist of any sort of material as, for example, epoxy, plastic, laminate, ceramic or metallic material, copper or copper alloy or iron/nickel alloy. The carrier can be connected mechanically and electrically with a contact element of the semiconductor chip(s). The semiconductor chip(s) can be connected to the substrate by one or more of re-flow soldering, vacuum soldering, diffusion soldering or adhering by means of a conductive or non-conductive adhesive. If diffusion soldering is used as connection technology between the semiconductor chip(s) and the substrate, solder materials can be used which may result in intermetallic phases at the interface between the semiconductor and the substrate due to interface diffusion processes after the soldering process. In case of copper or iron/nickel carriers it is therefore desirable to use solder materials including or consisting of AuSn, AgSn, CuSn, AgIn, AuIn or CuIn. Alternatively, if the semiconductor chip(s) are to be adhered to the substrate, conductive adhesives can be used. The adhesives can, for example, be based on epoxy resins which can be enriched with particles of gold, silver, nickel or copper to enhance their electrical conductivity.

The semiconductor chip(s) may be covered with an encapsulation material. The encapsulation material may be electrically insulating. The encapsulation material may include or may be made of any appropriate plastic or polymer material such as, e.g., a duroplastic, thermoplastic or thermosetting material or laminate (prepreg), and may e.g. contain filler materials. Various techniques may be employed to encapsulate the semiconductor chip(s) with the encapsulation material, for example compression molding, injection molding, powder molding, liquid molding, transfer molding or lamination. Heat and/or pressure may be used to apply the encapsulation material.

In several examples layers or layer stacks may be applied to one another or materials may be applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

A substrate for an electronic device may include a dielectric material and an electrically conductive material. A substrate for an electronic device (or "substrate" for short) may include one or more layers. For example, a substrate may include a layer including a dielectric material and a layer including a conductive material. The conductive material may be disposed in a layer over the dielectric layer or it may be disposed in a layer that includes both the conductive material and a dielectric material.

The conductive material of the substrate may include conductive traces and may be part of an electrical redistribution layer (RDL). The RDL may include contact pads for connecting an electronic component like for example a semiconductor chip or a printed circuit board (PCB) to the substrate. The electronic component may be connected to the substrate by any suitable means, for example by bonding wires or solder bumps. For example, the electronic component may be a semiconductor chip and may be connected to contact pads of the substrate by bond wires or in flip-chip manner.

According to an example, the substrate may be part of a semiconductor package that is a package including one or more semiconductor chips, wherein the substrate may act as a chip carrier configured to connect the one or more semiconductor chips to e.g. a PCB. According to another example, the substrate may be a PCB.

The conductive material (e.g. the conductive traces) of the substrate may be embedded in or covered by a dielectric material of the substrate. According to an example of a substrate, conductive traces are arranged on a first dielectric material and covered by a second dielectric material. For example, the second dielectric material may include one or more of a photoresist and a solder stop layer.

The conductive material or the conductive traces may include or consist of any suitable conductive material, e.g. a metal like Cu, Al, Ag, Au or a metal alloy including one or more of these materials. A plating may be arranged over the conductive traces, for example a plating including Ni or Au. The plating may be configured as a protective layer. Alternatively or additionally, another protective layer may be arranged over the conductive traces, for example a layer including or consisting of an organic material.

In order to connect some electronic component to a contact pad of the substrate it is necessary to expose the contact pad from any dielectric material. According to an example, the substrate may be fabricated in a way that the contact pad is exposed. According to another example, the substrate may be fabricated such that the contact pad is covered by a dielectric material which is subsequently removed by a suitable technique, for example by photolithography.

Figure 1A:
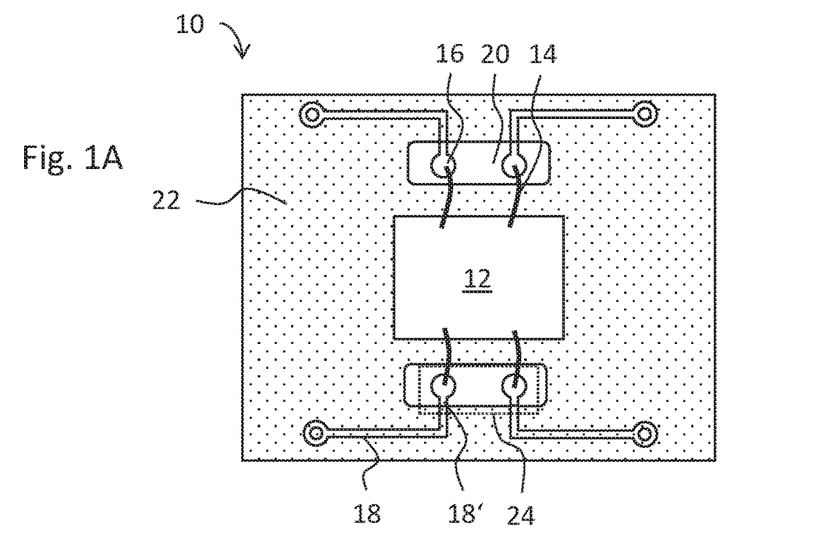
FIG. 1A shows a top view of the substrate.

FIG. 1A shows an exemplary substrate 10. A semiconductor chip 12 is arranged on the substrate 10 and is electrically coupled to the substrate 10 via bonding wires 14. It should be noted that for the following disclosure it is not relevant if the substrate 10 is a chip carrier or how many chips are coupled to the substrate or how the chips are coupled to the substrate. Furthermore, the substrate 10 could also be a PCB. The substrate 10 shown as a chip carrier in FIG. 1A is merely one example.

The bonding wires 14 are coupled to contact pads 16 of conductive traces 18. The contact pads 16 are shown to have a circular shape, however contact pads according to the disclosure may have any suitable shape, for example a rectangular shape, diamond shape, elliptic shape, etc. The conductive traces 18 are arranged on a first dielectric layer 20. A second dielectric layer 22 is disposed over the first dielectric layer 20 and the conductive traces 18. According to an example, the second dielectric layer 22 may (almost) completely cover the first dielectric layer 20 as shown in FIG. 1A and also may partially cover the conductive traces 18. According to another example, the second dielectric layer 22 may only partially cover the first dielectric layer 20 and may also partially cover the conductive traces 18. According to yet another example, the second dielectric layer 22 does not cover the first dielectric layer 20, but only partially covers the conductive traces 18.

Figure 1B:
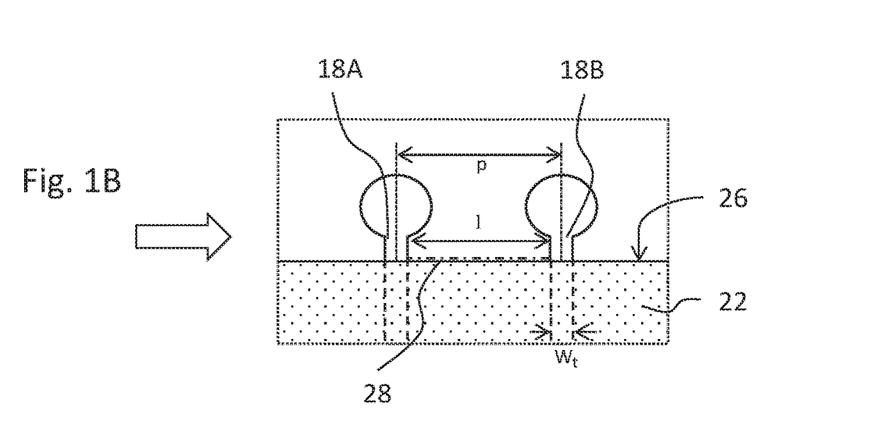
FIG. 1B shows an exploded view of a detail of FIG. 1A

An exposed part 18' of the conductive traces 18 is exposed from the second dielectric layer 22 at an opening 24. In this context "exposed" may particularly mean that the exposed part 18' of the conductive traces 18 is not covered by the second dielectric layer 22. The opening 24 may be open to the outside according to an example, and it may be covered by an encapsulant according to another example. The encapsulant may be a mold material. For example, the encapsulant may be applied over the opening 24 after the bonding wire(s) 14 have been connected to the contact pad(s) 16 of the opening 24.

FIG. 1B shows an exploded view of that part of substrate 10 which is framed by the dotted line in FIG. 1A (the bonding wires 14 were omitted in FIG. 1B for the sake of clarity). FIG. 1B shows a first conductive trace 18A and a second conductive trace 18B which are exposed from the second dielectric layer 22 at an interface 26. The part of the conductive traces 18A, 18B that is covered by the second dielectric layer 22 is shown with dashed lines, and the exposed part 18' is shown with continuous lines. The first and second conductive traces 18A and 18B are spaced apart by a pitch p, wherein the pitch p may be defined as the distance between the centerlines of the first and second conductive traces 18A, 18B (see FIG. 1B).

According to an example, a width $w_t$ of the conductive traces 18A, 18B may be large compared to the pitch p. For example, $w_t$ may be about equal to half the pitch p or about equal to p or larger than p. All conductive traces may have the same width $w_t$ or individual conductive traces may have different widths $w_t$. According to another example, $w_t$ may be small compared to p, therefore a distance l; between the conductive traces 18A, 18B (i.e. the pitch p minus half the width of trace 18A and half the width of trace 18B) may be close to the value of the pitch p. The pitch may for example be about 10 µm (micrometer), about 12 µm (micrometer), about 15 µm (micrometer), about 20 µm (micrometer), about 30 µm (micrometer), about 40 µm (micrometer), about 50 µm (micrometer), about 60 µm (micrometer), about 70 µm (micrometer), about 80 µm (micrometer), or more than 80 µm (micrometer). The width $w_t$ may have the same values. The distance l; may for example be about 10 µm (micrometer), about 20 µm (micrometer), about 30 µm (micrometer), about 40 µm (micrometer), or more than 40 µm (micrometer).

Certain conditions, for example electrochemical migration due to a difference in voltage between the first and second conductive traces 18A, 18B and/or moisture enclosed at the interface 26, may cause the formation of a leakage path 28 (indicated by the dotdashed line in FIG. 1B) along the interface 26 between the first and second conductive traces 18A, 18B. A length of the leakage path 28 may be equal to the distance l. A smaller pitch p (or smaller distance l) may increase the likelihood that such unwanted leakage path 28 is formed. It may therefore be desirable to increase the pitch p (or the distance l) in order to minimize the likelihood of leakage path formation. However, design requirements and/or the trend to further miniaturization may limit the maximum available pitch p.

Figure 1C:
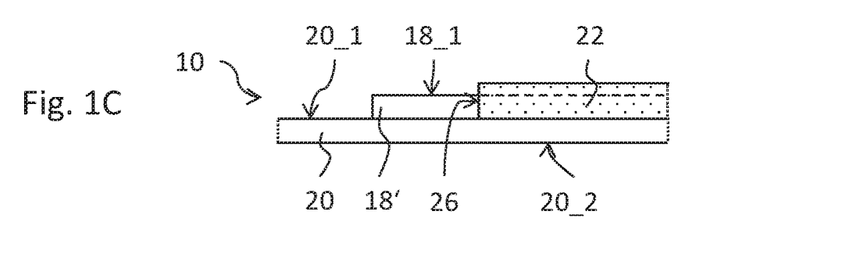
FIG. 1C shows a side view of the detail of FIG. 1B.

FIG. 1C shows a side view of the detail of substrate 10 along the arrow in FIG. 1B. FIG. 1C shows the first dielectric layer 20, the exposed part 18' of the first conductive trace 18A disposed on an upper face 20_1 of the first dielectric layer 20 and the second dielectric layer 22. The first dielectric layer 20 may be a single layer or may include several distinct layers. The second dielectric layer 22 may be disposed on the upper face 20_1 of the first dielectric layer 20 between the conductive traces 18A, 18B. The second dielectric layer 22 may also be disposed on an upper face 18_1 of the conductive traces 18A, 18B. The interface 26 may have a vertical or almost vertical orientation with respect to the upper face 20_1 of the first dielectric layer.

According to an example, the first and second dielectric layers 20, 22 may be a common single dielectric layer which encapsulates the conductive traces 18. In this case, the opening 24 may be formed by removing a part of the common single dielectric layer.

According to an example, the substrate 10 may be configured to be arranged on a part such that the lower face 20_2 of the first dielectric layer 20 faces the part. The part may e.g. be a board like a PCB. According to an example, the substrate 10 includes a second conductive layer including conductive traces arranged on the lower face 20_2 of the dielectric layer 20.

FIGS. 2A to 2D show an exploded view of four different examples of openings 210, 220, 230, 240 included in a substrate according to the disclosure, wherein the interface 26 has a different shape in each example. The openings 210, 220, 230, 240 may be included in a substrate like the substrate 10 of FIG. 1A. The openings 210, 220, 230, 240 may be identical to the opening 24 shown in FIGS. 1A and 1B except for the different shape of the interface 26. The openings 210, 220, 230, 240 may be identical among each other except for the difference in the shape of the interface 26 shown in FIGS. 2A to 2D. The openings 210, 220, 230, 240 may include an interface with a periodic pattern. A period length of the periodic pattern may equal a pitch of the conductive traces arranged in the openings 210, 220, 230, 240.

In each one of the examples of FIGS. 2A to 2D a potential leakage path 28' along the interface 26 is longer than the distance l; (i.e. longer than a straight line) between the first and second conductive traces 18A, 18B, because a shape of the interface 26 between the first and second conductive traces 18A, 18B includes one or more of an angle, an edge, a curvature, a bulge, a step and an indentation. The potential leakage path 28' may for example be about 20%, 40%, 60%, 80%, 100%, 150%, 200%, or even more than 200% longer than the distance l.

The openings 210, 220, 230, 240 may include a third conductive trace, wherein the third conductive trace neighbors the second conductive trace 18B. A shape of the interface 26 between the second 18B and third conductive traces may be identical to the shape of the interface 26 between the first 18A and second 18B conductive traces, or the shape of the interface 26 between the second 18B and third conductive traces may be the inverse of the shape of the interface between the first 18A and second 18B conductive traces. The openings 210, 220, 230, 240 may further include a fourth conductive trace, wherein the fourth conductive trace neighbors the first conductive trace 18A and may include any suitable number of further conductive traces.

A size s of the exemplary shapes of interface 26 shown in FIGS. 2A to 2D may be smaller than the distance l, equal to the distance l, or larger than the distance l. For example, the size s may be about 5 µm (micrometer), about 10 µm (micrometer), about 12 µm (micrometer), about 15 µm (micrometer), about 20 µm (micrometer), about 30 µm (micrometer), about 40 µm (micrometer), about 50 µm (micrometer), about 60 µm (micrometer), about 70 µm (micrometer), about 80 µm (micrometer), or more than 80 µm (micrometer).

Figure 2A:
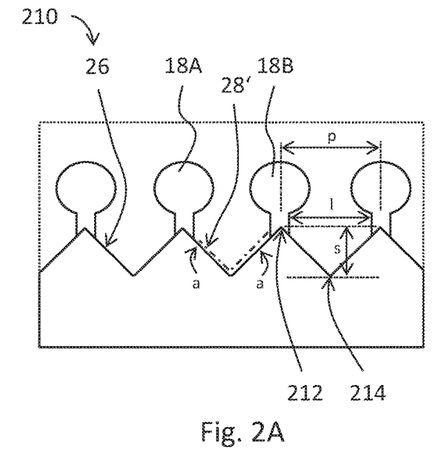
FIGS. 2A to 2D show top views of different examples of a detail of a substrate for an electronic device according to the disclosure, wherein the substrate includes conductive traces that are exposed at an opening along an interface with different shapes.

The opening 210 shown in FIG. 2A includes an interface 26 with a saw tooth shape including outer 212 and inner 214 edges. According to an example, two neighboring outer edges 212 may be spaced apart at a distance that equals the pitch p between the respective conductive traces as shown in FIG. 2A. Two neighboring inner edges 214 may be spaced apart at a distance that equals the pitch p. According to an example, two neighboring outer edges 212 or two neighboring inner edges 214 may be spaced apart at a distance that equals an integer multiple of the pitch p or a half integer multiple of the pitch p, for example 1*p, 1.5*p, 2*p, 2.5*p, or 3*p.

The edges 212, 214 of the saw tooth shape need not necessarily be sharp edges as shown in FIG. 2A, but may also be rounded edges. In other words, the opening 210 may also have a sinusoidal shape instead of a sharp edged saw tooth shape.

The shape of the interface 26 of opening 210 may be designed such that an outer edge 212 is aligned with the centerline of each conductive trace (as shown in FIG. 2A) or such that an inner edge 214 is aligned with the centerline of each conductive trace.

Figure 2B:
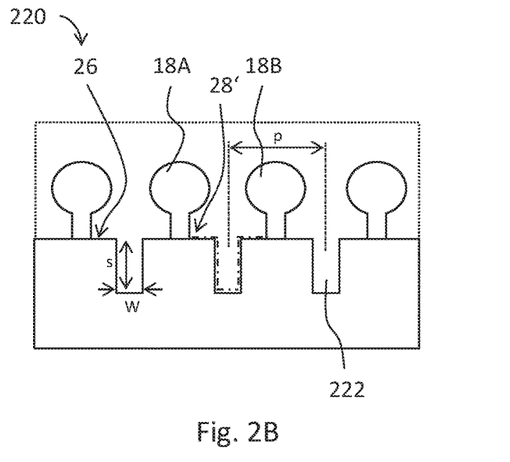

The opening 220 shown in FIG. 2B includes an interface 26 with an indentation 222 arranged between a first 18A and a second 18B conductive trace. In particular, an indentation 222 may be arranged between each pair of neighboring conductive traces. The indentation 222 may have any appropriate width w. The width w may be small compared to the distance l, it may be about ¼ of l, ⅓ of l, ½ of l, ¾ of l, or it may be almost equal to the distance l. The centerlines of two neighboring indentations 222 may be spaced apart by a distance that is equal to the pitch p of two neighboring conductive traces.

According to an example, more than one indentation 222 is arranged between two neighboring conductive traces. According to an example, the indentations 222 have a rectangular shape as shown in FIG. 2B. According to another example, the indentations 222 have another suitable shape. The indentations 222 may for example have rounded edges, may have a curved shape, may have a triangular shape, etc.

Figure 2C:
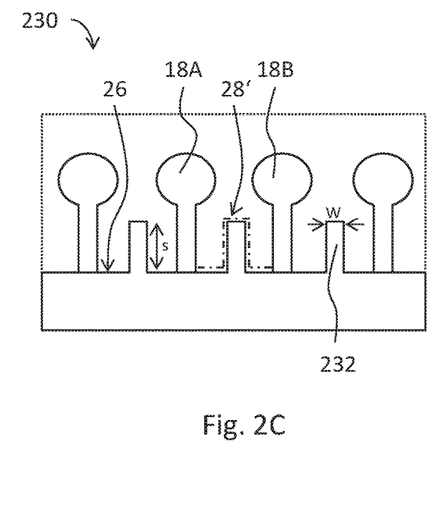

The opening 230 shown in FIG. 2C includes an interface 26 with a bulge 232 arranged between a first 18A and a second 18B conductive trace. The bulge 232 may have a width w as described with respect to FIG. 2B. Neighboring bulges 232 may be spaced apart at a distance equal to the pitch p as described with respect to FIG. 2B. According to an example, more than one bulge 232 may be arranged between neighboring conductive traces 18A, 18B. A bulge 232 does not necessarily need to have a rectangular shape as shown in FIG. 2C and may for example have rounded edges, may have a triangular shape, a tongue shape, etc.

Figure 2D:
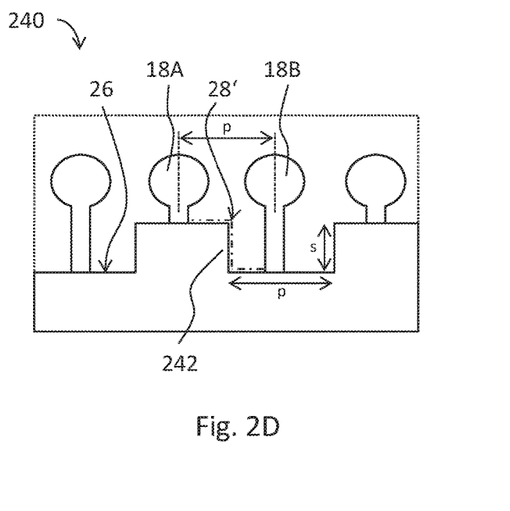

The opening 240 shown in FIG. 2D includes an interface 26, wherein a step 242 is arranged between a first conductive trace 18A and a second 18B conductive trace. Neighboring steps 242 may be spaced apart at a distance equal to the pitch p. According to an example, the steps 242 may include rounded edges. According to an example, the steps 242 may be arranged in the middle between respective neighboring conductive traces.

Figure 3A:
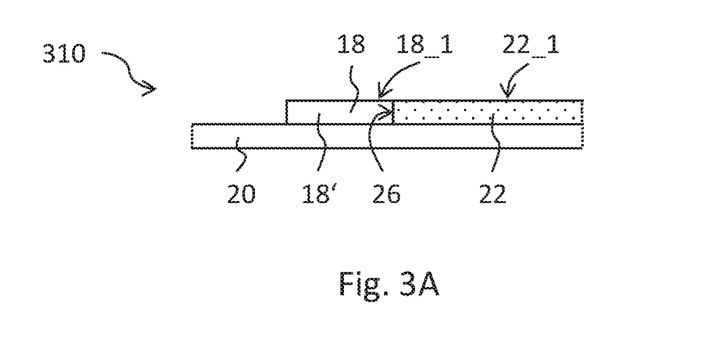
FIGS. 3A to 3C show side views of different examples of substrates according to the disclosure.
Figure 3B:
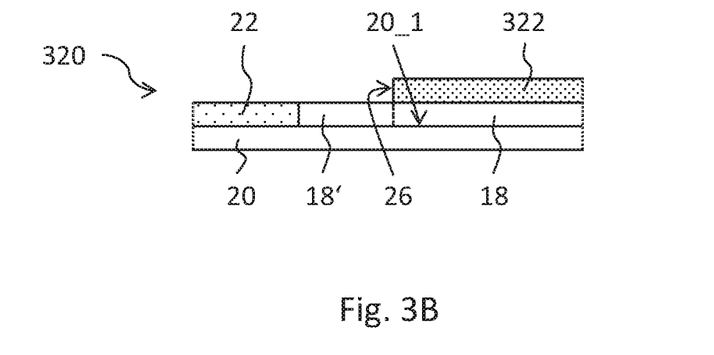
Figure 3C:
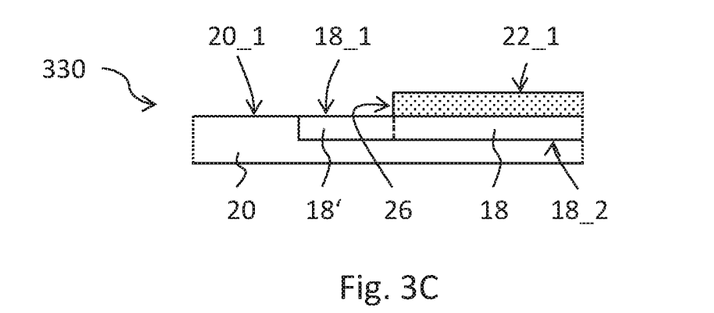

FIGS. 3A to 3C show side views of further examples of substrates 310, 320, 330 which may include an opening like the openings 210 to 240 shown in FIGS. 2A to 2D. Substrates 310, 320, 330 may be identical to substrate 10 shown in FIG. 1C except for the differences mentioned below.

As shown in FIG. 3A, a substrate 310 may include the first dielectric layer 20, the second dielectric layer 22 and the conductive traces 18. The exposed part 18' of the conductive traces 18 may be exposed from the second dielectric layer 22 at the interface 26. The conductive traces 18 may have an upper face 18_1 that is coplanar with an upper face 22_1 of the second dielectric layer 22. According to an example, the substrate 310 may be fabricated by applying a grinding process to the substrate 10 shown in FIG. 1C and grinding down the upper face 22_1 of the second dielectric layer.

As shown in FIG. 3B, a substrate 320 may further include a third dielectric layer 322 arranged over the conductive traces 18. The exposed part 18' may be exposed from the third dielectric layer 322 at the interface 26.

The third dielectric layer 322 may include or consist of the same material(s) as the first or second dielectric layers 20, 22. Alternatively, the third dielectric layer 322 may include or consist of different material(s). For example, the third dielectric layer 322 may be one or more of a solder stop, a laminate and a photoresist.

According to an example, the second dielectric layer 22 is not arranged in between the exposed parts 18' of neighboring conductive traces 18. The interface 26 may therefore reach down between the conductive traces 18 to the upper face 20_1 of the first dielectric layer 20 (this is shown by the dashed line in FIG. 3B).

As shown in FIG. 3C, a substrate 330 may include the first dielectric layer 20, the conductive traces 18 embedded in the first dielectric layer 20 and the third dielectric layer 322. Upper faces 20_1, 18_1 of the first dielectric layer and the conductive traces may be coplanar. The exposed part 18' of the conductive traces 18 may be exposed from the third dielectric layer 322 at the interface 26. The interface 26 may extend down to the lower face 18_2 of the conductive traces 18 as indicated by the dashed line in FIG. 3C. Therefore, there may be no first dielectric layer 20 arranged in between the exposed parts 18' of neighboring conductive traces 18.

Figure 4:
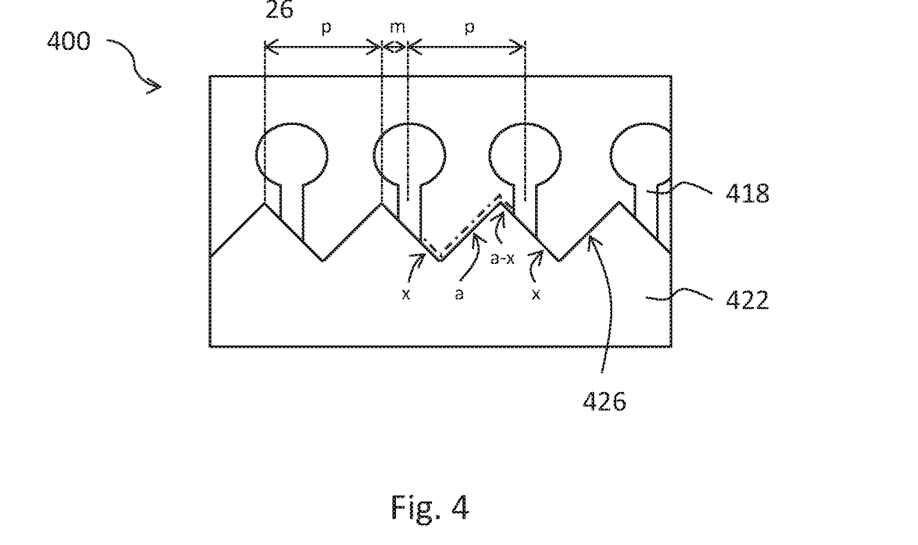
FIG. 4 shows a top view of a detail of a substrate according to the disclosure, wherein there is a misalignment between the conductive traces and the specifically shaped interface of the opening of the substrate.

FIG. 4 shows an opening 400 that is similar to the opening 210 shown in FIG. 2A. However, in the opening 400 there is a misalignment m between the conductive traces 418 and the dielectric layer 422. The misalignment m may e.g. result from fabrication tolerances. Since the periodicity of the saw tooth patterned interface 426 equals the pitch p between neighboring conductive traces 418, the misalignment m does not affect the length of a potential leakage path along the interface 426: the length of the potential leakage path 28' in the case of perfect alignment (see FIG. 2A) is 2a, and the length of the potential leakage path in the case of misalignment (see FIG. 4) is also x+a+(a−x)=2a. The same holds true for an interface 426 with e.g. a sinusoidal shape so long as its periodicity equals the pitch p.

Figure 5:
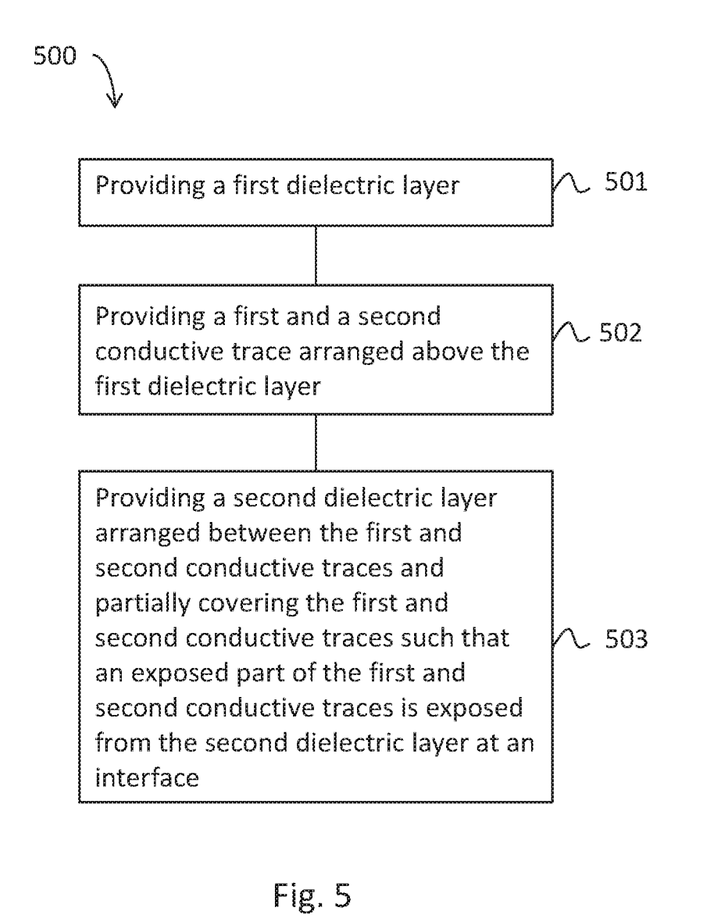
FIG. 5 shows a flow diagram of a method for fabricating a substrate for an electronic device according to the disclosure.

FIG. 5 shows a flow diagram of a method 500 for fabricating a substrate for an electronic device, for example substrates 10, 310, 320, or 330 including one or more openings like the openings 210, 220, 230 and 240. The method 500 includes a first act 501 of providing a first dielectric layer, a second act 502 of providing a first and a second conductive trace arranged over the first dielectric layer and a third act 503 of providing a second dielectric layer arranged between the first and second conductive traces and partially covering the first and second conductive traces such that an exposed part of the first and second conductive traces is exposed from the second dielectric layer at an interface.

Providing the second dielectric layer may include forming a shape of the interface between the first and second conductive traces that includes one or more of an angle, an edge, a curvature, a bulge, a step and an indentation. Providing the second dielectric layer may comprise an act of removing the second dielectric layer from the exposed part of the first and second conductive traces along the interface. Removing the second dielectric layer from the exposed part of the first and second conductive traces may include one or more of a photolithography process and a laser direct imaging (LDI) process. Furthermore, a photomask may be used in the photolithography process, wherein the photomask includes the shape of the interface between the first and second conductive traces. The method 500 may further include a further act of covering the exposed part of the first and second conductive traces with an encapsulant.

While the disclosure has been illustrated and described with respect to one or more implementations, alterations and/or modifications may be made to the illustrated examples without departing from the spirit and concept of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A substrate, comprising:
a first dielectric layer,
a first and a second conductive trace arranged over the first dielectric layer; and
a second dielectric layer arranged between the first and second conductive traces and partially covering the first and second conductive traces,
wherein an exposed part of the first and second conductive traces is exposed from the second dielectric layer at an interface,
wherein a course of the interface between the first and second conductive traces comprises one or more of a saw tooth shape, a square function and a step function, and
wherein the course of the interface is located in a plane spanned by the conductive traces.

2. The substrate of claim 1, wherein the course of the interface comprises a periodic pattern.

3. The substrate of claim 2, wherein the first and second conductive traces are arranged at a certain pitch and wherein a period length of the periodic pattern equals the certain pitch.

4. The substrate of claim 1, further comprising a third conductive trace arranged over the first dielectric layer,
wherein the second dielectric layer is arranged between the third conductive trace and the second conductive trace and partially covers the third conductive trace,
wherein an exposed part of the third conductive trace is exposed from the second dielectric layer at an interface, and
wherein a course of the interface between the second and third conductive traces is identical to the course of the interface between the first and second conductive traces, or wherein the course of the interface between the second and third conductive traces is the inverse of the course of the interface between the first and second conductive traces.

5. The substrate of claim 1, wherein the exposed part of the conductive traces comprises at least one bonding pad.

6. The substrate of claim 1, further comprising a third dielectric layer arranged over the conductive traces.

7. The substrate of claim 6, wherein the third dielectric layer comprises at least one of a photoresist, a laminate and a solder stop layer.

8. The substrate of claim 1, wherein one or more of the first and second dielectric layers comprises a laminate.

9. The substrate of claim 1, wherein the conductive traces are part of an electrical redistribution layer.

10. The substrate of claim 1, wherein the second dielectric layer comprises a solder stop layer.

11. The substrate of claim 1, comprising a misalignment between the conductive traces and the course of the interface.

12. The substrate of claim 1, wherein a pitch between the first and second conductive traces is in a range between 10 micrometers and 80 micrometers.

13. The substrate of claim 1, wherein a length of the interface between the first and second conductive traces is within a range of 10 micrometers to 40 micrometers.

14. A method for fabricating a substrate, the method comprising:
providing a first dielectric layer;
providing a first and a second conductive trace arranged over the first dielectric layer; and
providing a second dielectric layer arranged between the first and second conductive traces and partially covering the first and second conductive traces such that an exposed part of the first and second conductive traces is exposed from the second dielectric layer at an interface,
wherein a course of the interface between the first and second conductive traces comprises one or more of a saw tooth shape, a square function and a step function, and
wherein the course of the interface is located in a plane spanned by the conductive traces.

15. The method of claim 14, wherein providing the second dielectric layer comprises a process step of removing the second dielectric layer from the exposed part of the first and second conductive traces along the interface.

16. The method of claim 15, wherein removing the second dielectric layer from the exposed part of the first and second conductive traces comprises one or more of a photolithography process and a laser direct imaging process.

17. The method of claim 16, wherein a photomask used in the photolithography process comprises the course of the interface between the first and second conductive traces.

18. The method of claim 14, further comprising:
covering the exposed part of the first and second conductive traces with an encapsulant.

* * * * *